(12) United States Patent
Michalk

(10) Patent No.: US 7,967,213 B2
(45) Date of Patent: Jun. 28, 2011

(54) FLAT TRANSPONDER AND METHOD FOR THE PRODUCTION THEREOF

(75) Inventor: Manfred Michalk, Erfurt (DE)

(73) Assignee: HID Global GmbH (DE)

( * ) Notice: Subject to any disclaimer, the term of this patent is extended or adjusted under 35 U.S.C. 154(b) by 1007 days.

(21) Appl. No.: 10/598,788

(22) PCT Filed: Mar. 11, 2005

(86) PCT No.: PCT/DE2005/000452
§ 371 (c)(1),
(2), (4) Date: May 31, 2007

(87) PCT Pub. No.: WO2005/088529
PCT Pub. Date: Sep. 22, 2005

(65) Prior Publication Data
US 2007/0278315 A1    Dec. 6, 2007

(30) Foreign Application Priority Data

Mar. 12, 2004 (DE) .................. 20 2004 003 701 U

(51) Int. Cl.
*G06K 19/07* (2006.01)
(52) U.S. Cl. ..................................... 235/492
(58) Field of Classification Search ................. 235/492
See application file for complete search history.

(56) References Cited

U.S. PATENT DOCUMENTS

| 5,888,624 A * | 3/1999 | Haghiri et al. ............. 428/195.1 |
| 5,936,227 A * | 8/1999 | Truggelmann et al. ....... 235/492 |
| 6,879,258 B2 * | 4/2005 | Kuroda et al. .............. 340/572.1 |

| 2001/0040186 A1 | 11/2001 | Okada |
| 2003/0132302 A1 | 7/2003 | Hattori |
| 2003/0197064 A1 | 10/2003 | Saint et al. |

FOREIGN PATENT DOCUMENTS
EP        1130542       9/2001
JP   2000155821 A   *   6/2000

OTHER PUBLICATIONS

German Office Action, Patent Application No. 05 742 940.9-1248, Feb. 20, 2008, 4 pgs.
International Search Report dated Jul. 28, 2005, for PCT Application No. PCT/DE2005/000452.

* cited by examiner

*Primary Examiner* — Seung H Lee

(74) *Attorney, Agent, or Firm* — Sheridan Ross P.C.

(57) ABSTRACT

The invention relates to a flat transponder having an electronic circuit which is arranged in a layer or in a layer composite and which contains at least one chip and conductor tracks or conductor wires, and also to a method for the production thereof. The invention is based on the object of specifying a transponder of the type mentioned at the beginning and a method for the production thereof which is flexible, has the most uniform thickness possible and can be bonded to further elements by means of water-based adhesives, its electronic components largely being protected against damage by bending and against being detected by feel. According to the invention, the object is achieved by a transponder in which the circuit is arranged in or on a circuit carrier (7) made of plastic, on whose two larger opposite outer surfaces a paper layer (6) applied by lamination is in each case applied.

18 Claims, 2 Drawing Sheets

FLAT TRANSPONDER AND METHOD FOR THE PRODUCTION THEREOF

CROSS REFERENCE TO RELATED APPLICATION

This application is a national stage application under 35 U.S.C. 371 of PCT Application No. PCT/DE2005/000452 having an international filing date of Mar. 11, 2005, which designated the United States, which PCT application claimed the benefit of German Application Serial No. 20 2004 003 701.7, filed Mar. 12, 2004, the entire disclosure of which is incorporated herein by reference herein.

The invention relates to a flat transponder having an electronic circuit which is arranged in a layer or in a layer composite and which contains at least one chip and conductor tracks or conductor wires, and also to a method for the production thereof.

The transponder according to the invention is suitable for being fixed by adhesive bonding both to rigid and to flexible elements made of paperboard, paper, material or plastic. The preferred area of application is the fitting of a contactless transponder in a passport cover.

Very flat transponders are also used for many applications in the form of contact-containing, contactless or hybrid designs. They normally have at least one chip, which is often arranged in a module, and also conductor tracks or conductor wires and, if appropriate, further electronic components. Contactless or hybrid designs need an antenna.

It is known that these arrangements are adhesively bonded into paper sections and also cast or laminated into plastics, in order to secure the position of the circuit and to avoid damage.

The protection required for these arrangements is intended to ensure both the positional security of their components and a certain rigidity, in order to be able to process and test the transponders in an automated manner.

For specific applications of these circuits, it is necessary that they permit both secure mechanical and electrical protection of the components and also high flexibility. In this case, it is frequently desirable not to disclose the position of the module in the circuit.

A further requirement is that the arrangement may be glued to further covering or protective layers by means of water-based adhesives in the same way as paperboard or paper.

Solutions are known which configure the protective layers applied to the circuit to be extremely thin or extremely soft, by these protective layers consisting of very soft plastic, for example synthetic paper, and also of woven or nonwoven material of natural or artificial fibers.

In the case of using synthetic papers, it is disadvantageous that these have a high thickness tolerance and cannot be bonded with water-based adhesives. Protective layers made of material do not permit circuits to be protected in such a way that dimensionally exact conditions for the circuit are ensured. Furthermore, the position of module and chip and/or of the electronic components can be detected by feel or is visible in relief. It is also disadvantageous that, although material can be adhesively bonded very well, it is stiffened by taking up adhesive.

The invention is based on the object of specifying a transponder of the type mentioned at the beginning and a method for the production thereof which is flexible, has the most uniform thickness possible and can be bonded to further elements by means of water-based adhesives, its electronic components largely being protected against damage by bending and against being detected by feel.

According to the invention, the object is achieved by a transponder which has the features specified in claim 1 and by a method which has the features specified in claim 14.

Advantageous refinements are specified in the subclaims.

The transponder contains a circuit which is arranged in an electrically insulating, flexible and water-resistant plastic element. A covering layer made of paper or a material similar to paper is laid onto the plastic element on one or both sides and fixed by lamination. In the sense of the invention, paper is understood to mean a sheet material which has predominantly been produced of natural fibers of different origin. One or both covering layers and, if appropriate, the partial layers of plastic arranged adjacently above it or under it are notched with incisions, so that the intrinsically stiff laminate with the circuit located in the interior of the laminate bends over at the notched points under bending loading, even with relatively low forces. The notches may be produced by drawn or punched incisions using special knives, by grinding, by sawing in, by laser cutting, etc.

A further possible way of producing the notches is to provide the laminating rolls or laminating plates needed for the laminating process with elevated, knife-like notching webs so that, with the lamination process, the notches are already pressed or cut into the laminate produced. In addition, a first notch pattern can be notched in with the lamination, and a second notch pattern can be notched in by means of additional notching following the lamination.

The notch depth and the notch cut density can be applied differently for regions of the laminate surface. In order not to be able to detect the module or chip in the laminate by feel and to prevent the conductor wires or conductor tracks from bending over at the module or chip connection, it is expedient not to flexibilize the regions surrounding the module or chip or to flexibilize them only slightly, in order additionally to make detecting the module or chip by feel more difficult.

Furthermore, it is expedient to configure the notch cuts in accordance with specific patterns, which permit identification and therefore ensure additional security against the simple plagiarization of the laminate. The patterns can represent specific lines, actual symbols, dot patterns and the like. In specific regions of the laminate, restricted in terms of their area, notching through or perforation is advantageous. When using grinding methods or laser cutting methods for producing the notches, it is possible to configure the cross section of the notches (width and opening angle) specifically as a security feature and/or in order to predefine a specific bending behavior, at least in one surface region of the laminate.

The laminates exhibit high evenness, a low thickness tolerance, high compressive strength and optimal mechanical protection of the module, chip, electronic components and conductor tracks or conductor wires. The laminates can be bonded with water-based adhesives.

The invention will be explained in more detail below by using exemplary embodiments.

Figure 1:
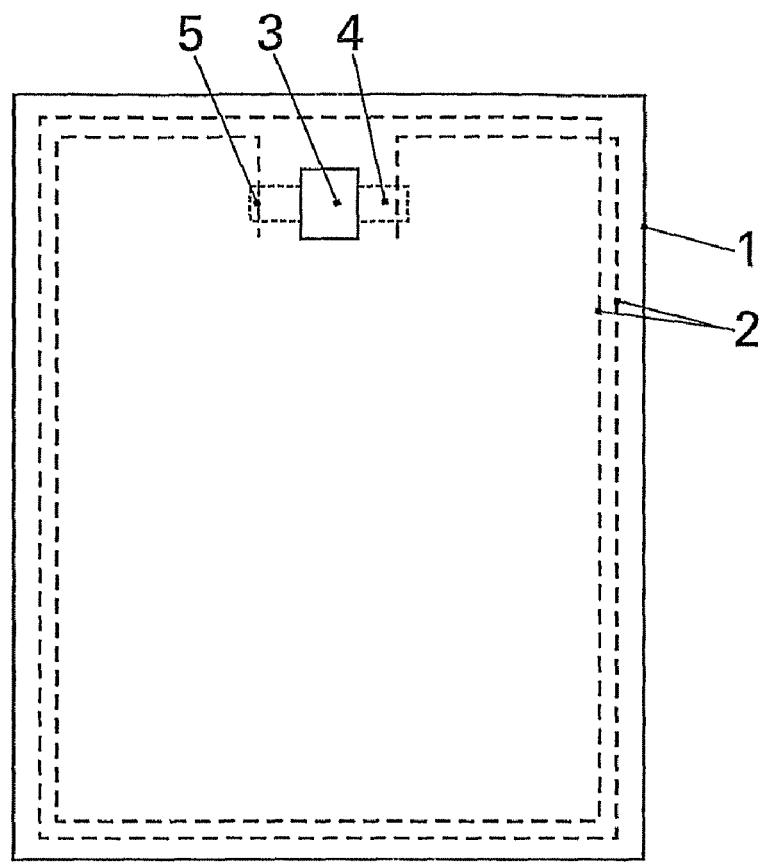
FIG. 1 shows a contactless transponder in plan view.

The arrangement illustrated in FIG. 1 shows a laminate 1 having a surface similar to a check card. Arranged in the laminate 1 is a module 3, whose module connections 4 are connected at the contact points 5 to the ends of the antenna 2.

The antenna 2 comprises a coil having two turns of copper wire provided with an electrically insulating layer and having a diameter of 50 μm.

Figure 2:
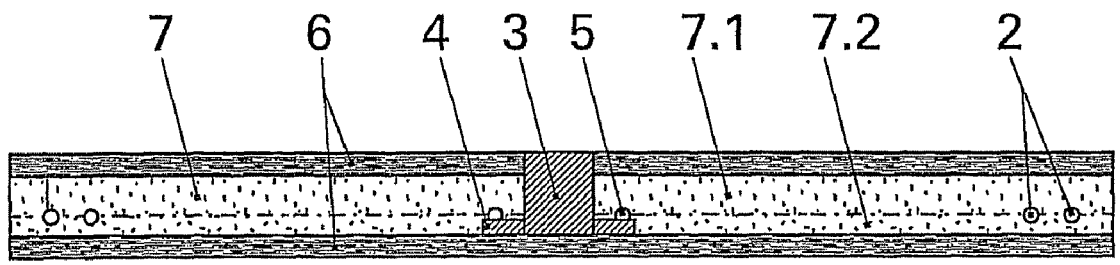
FIG. 2 shows a contactless transponder in cross section.

In FIG. 2, the laminate is shown in cross section. The antenna 2 is located in a circuit carrier 7 which, in the example, comprises a 200 μm thick upper plastic film 7.1 and a lower plastic film 7.2. Those films consist of polyethylene. Located on the upper plastic film 7.1 are the antenna 2 and the module connections 4 connected to the antenna 2 at the contact points 5. The thermosetting, rigid body of the module 3 is arranged in a hole which has been punched through the circuit carrier 7 and the paper layer 7 located above. Applied under the upper plastic film 7.1 is the lower plastic film 7.2, which is 100 μm thick in the example. A second paper layer 6 is arranged underneath the lower plastic film 7.2, so that the plastic films 7.1 and 7.2 are each covered by a 100 μm thick paper layer 6.

To produce the transponder, the material layers laid together one above another become a compact composite, the laminate 1, by means of hot lamination. Here, the conductor wires 2 are located between the two plastic films 7.1 and 7.2. During the lamination process, the plastic films 7.1 and 7.2 consisting of polyethylene temporarily soften. In the process, they bond to each other and to the paper layers 6. In the example, the paper layers 6 consist of paper of the stiff grade "coated paper". The stiff paper layers 6 on the outer sides of the laminate 1 prevent the polyethylene core consisting of the plastic films 7.1 and 7.2 from shrinking during the lamination and significantly changing the position of the conductor tracks or conductor wires 2 forming the antenna 2. By means of the non-shrinking paper layers 6 to which the plastic films 7.1 and 7.2 are fused, positional stabilization of the electronic circuit and of the entire plastic core is achieved. This positional stabilization can be achieved for virtually all plastics to be laminated.

The paper layers 6 consisting of coated paper additionally prevent the plastic films 7.1 and 7.2 that soften during the lamination from impregnating the fiber composite of the paper layers 6 completely. For this arrangement, the impregnation is not desired, since a paper completely impregnated with polyethylene—complete integration cannot be avoided in the case of thin, uncoated papers—cannot be bonded by means of water-based adhesives or can be bonded only very poorly. Furthermore, depending on the level of impregnation of the uncoated paper by the plastic films 7.1 and 7.2 to be laminated in the composite, the thickness of the laminate 1 fluctuates very considerably, since some of the plastic compound is taken up by the paper layers 6. On the other hand, stiffening of the layer composite results from the lamination, which is normally not desired.

Figure 3:
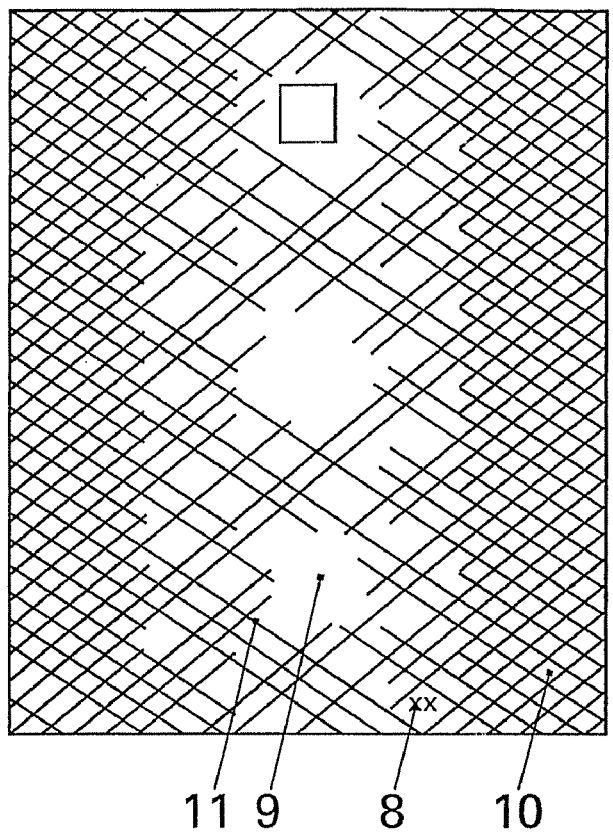
FIG. 3 shows a plan view of an arrangement having notches.

In order to obtain flexible laminates 1 despite lamination, the outer paper layers 6, which contribute significantly to the stiffening, are provided with notches 11 illustrated in FIG. 3. The notches 11 are primarily implemented in the left and right edge region of the laminate 1 in close cut patterns in order to increase the flexibility. The edge regions therefore become regions of lower flexural rigidity 10.

Regions of high flexural rigidity 9 are arranged in the center of the laminate. To this end, the region around the module 3 has no notches 11, in order to prevent the laminate 1 from being able to be bent over directly at the module 3. In addition, two further areas similar to a module are implemented without notches 11, in order that simple detection of the exact position of the module 3 by feel is not possible. Furthermore, two special symbols 8 are notched in the vicinity of the lower edge of the laminate 1, permitting individual identification of the laminate 1 and/or the batch with a producer's identifier, the date of production and the like.

In the example illustrated, the notches 11 are arranged in the manner of diamonds but, depending on the desired flexibility of the laminate 1, depending on the technological possibilities and depending on the design wish, other notch arrangements are possible. For example, the notches 11 can be made in the form of waves, overlapping ring forms, any desired polygonal forms and so on. In the example, the notch cuts 11 have been produced by means of a $CO_2$ laser following the lamination.

Figure 4:
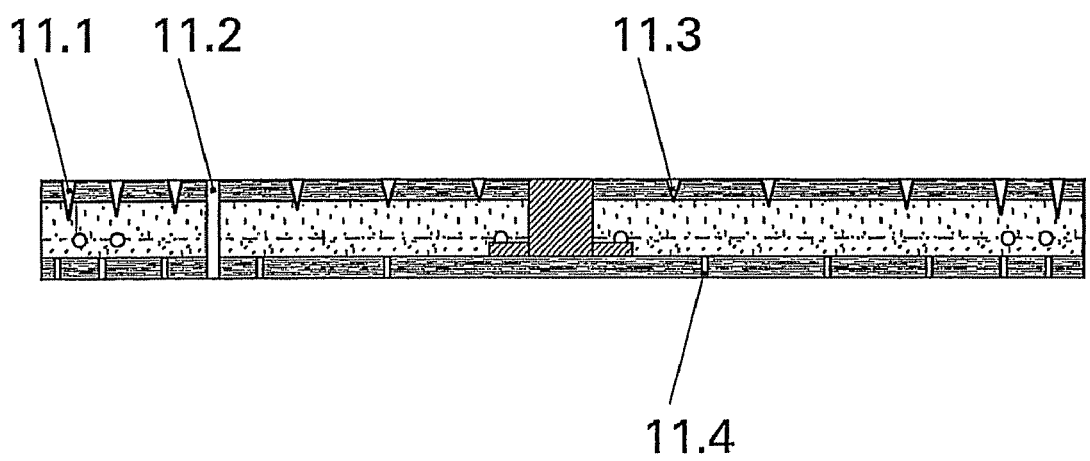
FIG. 4 shows the arrangement having notches in cross section.

FIG. 4 explains possibilities of various types for the application of notches 11 to the laminate 1. Both surface sides of the laminate 1 have been provided with notches 1, each surface side having different notches corresponding to the flexibilities required for the respective bending directions. To this end, deep V-shaped notches 11.1 can be applied in specific regions and shallow V-shaped notches 11.3 can be applied in other regions.

Furthermore, it is possible to arrange the notches 11 as through notches 11.2 or in the form of a trench cut 11.4. In FIG. 4, the upper side of the laminate 1 has V-shaped notch cuts, which are arranged at the edges of the laminate 1 at reducing intervals and as deep V-shaped notches. In the center of the laminate 1, shallow V-shaped notches 11.3 have been made. The shallow V-shaped notches 11.3 notch only the paper layer 6. At the edge of the laminate 1 there are deep V-shaped notches 11.1, which notch the paper layer 6 and about 30% of the thickness of the circuit carrier 7. On the lower surface side of the laminate 1, trench cuts 11.4 have been introduced, which notch only the paper layer 6. For particular identification, the laminate 1 is provided with dot-like through notching 11.2 on the left side.

LIST OF DESIGNATIONS

1 Laminate
2 Antenna
3 Module
4 Module connection
5 Contact point
6 Paper layer
7 Circuit carrier
7.1 Upper plastic film
7.2 Lower plastic film
8 Special symbol
9 Region of high flexural rigidity
10 Region of low flexural rigidity
11 Notches
11.1 Deep V-shaped notch cut
11.2 Through notch
11.3 Shallow V-shaped notch cut
11.4 Trench cut

I claim the following:

1. A flat transponder having an electronic circuit which is arranged in a layer or in a layer composite and which contains at least one chip and conductor tracks or conductor wires, wherein the circuit is arranged in or on a circuit carrier (7) made of plastic, on whose two larger opposite outer surfaces a paper layer (6) applied by lamination is in each case applied, wherein notches are introduced into at least one paper layer in order to increase the flexibility and wherein the notches are applied at different intervals or with a different depth on the various sections of the paper layer in order to create surface regions of different flexibility or different flexibility directions.

2. Transponder according to claim 1, wherein the notches do not disclose the position of the chips.

3. The transponder as claimed in claim 1, wherein the notches are made in the form of trenches having parallel or V-shaped limits.

4. The transponder as claimed in claim 1, wherein the depth of the notches is less than the thickness of the paper layer.

5. The transponder as claimed in claim 1, wherein the notches penetrate through the paper layer and penetrate into the adjacent layer of the circuit carrier.

6. The transponder as claimed in claim 1, wherein the notches are arranged in the form of visible cut patterns or symbols.

7. The transponder as claimed in claim 1, wherein the paper layer comprises coated paper.

8. The transponder as claimed in claim 1, wherein the circuit carrier consists of a layer in which an antenna and a module having module connections are embedded.

9. The transponder as claimed in claim 1, wherein the circuit carrier comprises at least two plastic films, between which there are arranged an antenna and a module having module connections.

10. The transponder as claimed in claim 1, wherein the circuit carrier comprises polyethylene.

11. The transponder as claimed in claim 1, wherein the circuit is enclosed completely by the material of the circuit carrier.

12. The transponder as claimed in claim 1, wherein the module consists of a rigid body which is arranged in an aperture which is located in the circuit carrier and the paper layer located above the latter.

13. A method for the production of a transponder having an electronic circuit: which is arranged in one of a layer and a layer composite and this contains at least one chip and conductor tracks of conductor wires, the method comprising:
    fitting the circuit in or on a circuit carrier made of plastic;
    applying a paper layer to both sides of the circuit carrier by lamination; and
    applying notches on at least one surface side of the laminate, wherein the notches are applied at different intervals or with a different depth on the various sections of the paper layer in order to create surface regions of different flexibility or different flexibility directions.

14. The method as claimed in claim 13, wherein the lamination comprises hot pressing of the circuit carrier and paper layers together between one of laminating plates or laminating rolls.

15. The method as claimed in claim 13, wherein the notches are produced during the lamination by notching webs fitted in an elevated manner to one of the laminating plates and laminating rolls, the form of said notching webs corresponds to the form of the notches to be produced.

16. The method as claimed in claim 13, wherein the notches are introduced by means of knife or saw cuts after the lamination.

17. The method as claimed in claim 13, wherein the notches are introduced by laser cuts after the lamination.

18. The method as claimed in claim 13, wherein the notches are produced by at least one of a knife, saw and laser introduced by laminating plates during the lamination.

* * * * *